United States Patent
Deak et al.

(10) Patent No.: US 9,341,686 B2
(45) Date of Patent: May 17, 2016

(54) SINGLE-PACKAGE POWER METER

(75) Inventors: James G. Deak, Jiangsu (CN); Insik Jin, Jiangsu (CN); Weifeng Shen, Jiangsu (CN); Songsheng Xue, Jiangsu (CN)

(73) Assignee: MultiDimension Technology Co., Ltd., Jiangsu (CN)

( * ) Notice: Subject to any disclaimer, the term of this patent is extended or adjusted under 35 U.S.C. 154(b) by 412 days.

(21) Appl. No.: 13/882,133

(22) PCT Filed: Oct. 26, 2011

(86) PCT No.: PCT/CN2011/081341
§ 371 (c)(1),
(2), (4) Date: Apr. 26, 2013

(87) PCT Pub. No.: WO2012/055354
PCT Pub. Date: May 3, 2012

(65) Prior Publication Data
US 2014/0062471 A1    Mar. 6, 2014

(30) Foreign Application Priority Data
Oct. 26, 2010    (CN) .......................... 2010 1 0518944

(51) Int. Cl.
| | |
|---|---|
| G01R 33/09 | (2006.01) |
| G01R 21/00 | (2006.01) |
| G01R 21/06 | (2006.01) |
| G01R 22/10 | (2006.01) |
| G01R 15/20 | (2006.01) |

(52) U.S. Cl.
CPC .............. *G01R 33/098* (2013.01); *G01R 21/00* (2013.01); *G01R 21/06* (2013.01); *G01R 22/10* (2013.01); *G01R 15/205* (2013.01)

(58) Field of Classification Search
CPC ....... G01R 33/098; G01R 21/06; G01R 21/08
See application file for complete search history.

(56) References Cited

U.S. PATENT DOCUMENTS

| | | | |
|---|---|---|---|
| 4,504,787 A | | 3/1985 | Planer |
| 5,241,263 A | * | 8/1993 | Naoi et al. ................. 324/117 H |
| 6,026,355 A | * | 2/2000 | Rahman et al. ............... 702/189 |
| 6,771,058 B2 | * | 8/2004 | Lapinksi et al. .......... 324/117 R |
| 2002/0041180 A1 | * | 4/2002 | Lancaster .............. G01R 21/08 324/117 R |
| 2007/0025028 A1 | * | 2/2007 | Chung et al. ................ 360/324.2 |
| 2007/0159159 A1 | * | 7/2007 | Okada .................. G01R 15/205 324/117 H |
| 2010/0026289 A1 | * | 2/2010 | Taylor et al. ................... 324/252 |

FOREIGN PATENT DOCUMENTS

JP             08146054 A        7/1996

* cited by examiner

*Primary Examiner* — Tung X Nguyen
*Assistant Examiner* — Adam Clarke
(74) *Attorney, Agent, or Firm* — Stites & Harbison PLLC; Richard S. Myers, Jr.

(57) ABSTRACT

A single-package power meter is disclosed for measuring the power consumed by a load connected to an electrical conductor. The power meter is galvanically isolated from the electrical conductor through the use of magnetic sensors or through the combination of magnetic sensors and capacitors. Instantaneous power consumed at the load and other desired parameters are determined by measuring the voltage of the load and current flowing through the electrical conductor. Current is measured using a magnetic sensor to detect the magnetic field associated with the current flowing through the electrical conductor. Voltage is measured by one of two possible techniques involving magnetic sensors to measure the current flowing through a coil connected in parallel with a load, or through the use of a capacitively coupled voltage divider connected in parallel with the load. An application specific integrated circuit is further disclosed that controls the bias currents of the sensors for autoranging purposes and also for computing desired parameters, such as power consumption.

20 Claims, 8 Drawing Sheets

SINGLE-PACKAGE POWER METER

FIELD OF THE INVENTION

The present invention relates to devices used to measure the consumption of electrical power. More specifically, the present invention relates to the use of tunneling magnetoresistive (TMR) devices to measure current passing through an electrical conductor and voltage across a load connected to the electrical conductor.

BACKGROUND OF THE INVENTION

There is a trend in the power generation industry to move away from relatively high cost mechanical watt-hour meters towards lower cost more easily integrated solid state remote metering. Although integrated circuits have been developed for calculation of circuit parameters relevant to power metering, there remains a need for low cost solid-state energy measurement sensors that have increased immunity to electrical transients caused by the power supply network and the ability to accurately measure power consumption over a wide range of load and environmental conditions. There is thus a need for sensors that are galvanically isolated from the power supply network.

Additionally, power meters generally use discrete transducers with analog outputs to provide voltage and current information to the microprocessor circuitry that is used to computer power consumption. Due to the nature of the power measurement and constraints imposed by the required minimum size of power conductors, it is difficult to integrate the transducers into the same integrated circuit package as the microprocessor used for power computation. A transducer that provides a digital representation of the power parameters, such as the voltage and current of the load and provides this digital data on a galvanically isolated communication channel for easy integration with other metering functions would, therefore reduce cost and increase the reliability of solid-state utility meters.

A final consideration for power transducers is measurement resolution. For current measurement, there is an important trend to replace commonly used current transformers or Rogowski coils with Hall Effect Sensors or magnetoresistive sensors including anisotropic magnetoresistance (AMR) and giant magnetoresistance (GMR). Hall Effect devices are relatively expensive and lacking in absolute resolution. AMR and GMR devices although they are relatively high resolution devices, suffer from low signal amplitude and require careful attention to be paid to front end electronics design, which increases system complexity and size of the integrated circuit design and therefore increases cost. Tunneling magnetoresistance (TMR) devices, also called magnetic tunnel junction (MTJ) devices offers high resolution and large amplitude that can be used simplify front-end electronics design, thereby lowering total system cost.

SUMMARY OF THE INVENTION

To overcome the disadvantages of the prior art, the present invention provides a single-package power meter with digital output, high precision, and high resolution, in which the measurement system is galvanically isolated from the measurement source, through the use of TMR magnetic sensors or TMR magnetic current sensors combined with capacitive voltage sensing.

Instantaneous power consumed at the load and other desired parameters are determined by measuring the voltage of the load and current flowing through the electrical conductor. Current is measured by using a magnetic sensor to detect the magnetic field associated with the current flowing through the electrical conductor. Voltage is measured by one of two possible techniques involving magnetic sensors to measure the current flowing through a coil connected in parallel with a load, or through the use of a capacitive coupled voltage divider connected in parallel with the load. The voltage and current signal of the load is converted into the digital signal through the use of an analog-to-digital convertor (ADC), and computed by a microprocessor. Various parameters, such as instantaneous power, voltage, and current may be computed and communicated to a system by using interface logic circuit.

The specific technical solutions are as follows:

The first technical solution:

A single-package power meter that is used to measure the power consumed by a load connected to an electrical conductor, mainly comprising the following parts:

an internal electrical conductor that is connected in series between the power supply and load;

an internal resistor and voltage shunt coil that are connected in series between the internal power conductor and the external ground or neutral connector in order to produce voltage shunt coil that is connected in parallel with load;

a first magnetic sensor means disposed proximate to the internal electrical conductor such that it detects the magnetic field generated by the current following through the electrical conductor, which is used for detecting the magnetic flux around the power conductor and producing a first output (current signal) responsive to the magnetic flux and indicative of the current flowing in the power conductor;

a second magnetic sensor means disposed proximate to the voltage shunt coil, which is connected in parallel to the load, such that the second magnetic sensor means detects the magnetic field generated by the current following through the voltage shunt coil, the output of the second magnetic sensor being proportional to the current flowing in the voltage shunt coil and therefore providing a second output (voltage signal) indicative of the voltage across the load;

a sampling module for sampling the voltage signal and current signal and converting them into digital forms;

a processing module for processing the sampled data;

a multiplexer for selectively sampling the current signal output by the first magnetic sensor means and the voltage signal output by the second magnetic sensor means; and an interface logic module for transforming the processed data into a format that is compatible with the off-chip data-logging system, wherein the first magnetic sensor, the second magnetic sensor, the sampling module, the processing module, the data processing, and interface logic module are electrically and physically isolated from the shunt resistance coil and the electrical conductor. Galvanic isolation is accomplished through the use of magnetic coupling and insulating dielectric layers.

Preferably, the first magnetic sensor means and the second magnetic sensor means are MTJ devices.

Preferably, at least one magnetic sensor means has the bias voltage response characteristic curve that may be used to control the magnitude of the sensor response in order to adjust the range of sensor, and at least one magnetic sensor has an on-chip electromagnet used to linearize the sensor response.

The second technical solution:

A single-package power meter that is used to measure the power consumed by a load connected to a power supply, which comprises:

an internal conductor that is connected in series between the power supply and load;

an external capacitor that is used to galvanically isolate the voltage detection circuitry from the power supply conductor, which can be replaced with an RC network to set the bandwidth of the circuit;

a magnetic sensor disposed proximate to the internal conductor such that it detects the magnetic field generated by the current following through the conductor, which provides a first output (current signal) indicative of the current flowing in the load conductor;

an internal resistor connected across the two input terminals of an amplifier or buffer circuit, which is used in conjunction with the external capacitor to form a voltage divider network for measuring the voltage across the load;

a sampling module for sampling the voltage signal and current signal and converting them into digital forms;

a processing module for processing the sampled data;

a multiplexer for selectively sampling time of the current signal output by the first magnetic sensor and the voltage signal output by the second amplifier; and an interface logic module for transforming the processed data into a format that is compatible with an off-chip data-logging system.

Preferably, the magnetic sensor means is a MTJ device.

Preferably, the magnetic sensor means, the sampling module, the processing module, and the interface logic module are electrically and physically isolated from the power supply, and the galvanic isolation is accomplished through the use of magnetic coupling and insulating dielectric layers.

Preferably, the magnetic sensor means has the bias voltage response characteristic curve that can be used to control the magnitude of the sensor output.

Preferably, the magnetic sensor means has an on-chip electromagnet used to linearize the sensor response.

The third technical solution:

A single-package power meter that is used to measure the power consumed by a load connected to a power supply, which comprises:

an external conductor that is connected in series between the power supply and load;

an internal resistive voltage shunt coil that is connected in series between the external conductor and the external ground or neutral connector of the power system, such that the voltage shunt coil is connected in parallel with the load;

a first magnetic sensor means disposed within the power meter package and magnetically coupled to the current following through the external conductor, which is used for detecting the magnetic flux emanating from the external conductor and producing a first output (current signal) indicative of the current flowing in the external conductor;

a second magnetic sensor means disposed proximate to the voltage shunt coil connected in parallel to the load, and magnetically coupled to the magnetic field generated by the current following through the voltage shunt coil, which is used for detecting the current flowing through the voltage shunt coil and producing a voltage signal responsive to the current flowing in the voltage shunt coil and indicative of the voltage across the load;

an internal high permeability shielding structure used to shield the second magnetic sensor from the magnetic field produced by the external conductor, which is located far enough from the first magnetic sensor means such that it does not have significant impact on the first magnetic sensor means sensing the magnetic field from the external power conductor;

a sampling module for sampling the voltage signal and current signal and converting them into digital forms;

a processing module for processing the sampled data;

a multiplexer for selectively sampling the current signal output by the first magnetic sensor means and the voltage signal output by the second magnetic sensor means; and an interface logic module for transforming the processed data into a format that is compatible with an off-chip data-logging system.

Preferably, the first magnetic sensor and the second magnetic sensor are MTJ sensors.

Preferably, the first magnetic sensor means, the second magnetic sensor, the sampling module, the processing module, and the interface logic module are electrically and physically isolated from the internal resistive voltage shunt coil and the external conductor. Galvanic isolation is accomplished through the use of magnetic coupling and insulating dielectric layers.

Preferably, at least one magnetic sensor has the bias voltage response characteristic curve that can be used to control the magnitude of the sensor response in order to automatically adjust the range of sensor.

Preferably, at least one magnetic sensor has an on-chip electromagnet used to linearize the sensor response.

Preferably, the shielding structure is used to concentrate the magnetic flux from the external conductor into the region occupied by the first magnetic sensor.

Preferably, the first magnetic sensor is magnetically coupled to the power conductor through the use of a slotted ferromagnetic toroid external to the device package.

Preferably, the first magnetic sensor is magnetically coupled to the power conductor by placing the package proximate to the power conductor.

The fourth technical solution:

A single-package power meter that is used to measure the power consumed by a load connected to a power supply, mainly comprising the following parts:

an external conductor that is connected in series between the power supply and the load;

a first magnetic sensor means disposed within the power meter package and magnetically coupled to the external conductor, which is used for detecting the magnetic flux emanating from the external conductor and producing a first output (current signal) indicative of the current flowing in the external conductor;

an external capacitor that is used to galvanically isolate the voltage detection circuitry from the power supply conductor, which can be replaced with a RC network to adjust its bandwidth;

a resistor connected across the two input terminals of an amplifier or buffer circuit, which is used in conjunction with the external capacitor to form a voltage divider network for measuring the voltage across the load.

a sampling module for sampling the voltage and current signals in order to convert them into digital forms;

a processing module for processing the sampled data;

a multiplexer for selectively sampling the current signal output by the first magnetic sensor and the voltage signal output by the amplifier; and an interface logic module for transforming the processed data into a format that is compatible with an off-chip data-logging system.

Preferably, the magnetic sensors are MTJ sensors.

Preferably, the magnetic sensors, the sampling module, the processing module, and the interface logic module are electrically and physically isolated from the resistance voltage shunt coil and the external power conductor. Galvanic isolation is accomplished through the use of magnetic coupling and insulating dielectric layers.

Preferably, at least one magnetic sensor has the bias voltage response characteristic curve that is used to control the magnitude of the sensor response and automatically adjust the range of sensor.

Preferably, at least one magnetic sensor has an on-chip electromagnet used to linearize the sensor response.

Preferably, the shielding structure is used to concentrate the magnetic flux from the external conductor into the region occupied by the first magnetic sensor.

Preferably, the first magnetic sensor is magnetically coupled to the power conductor through the use of a slotted ferromagnetic toroid external to the device package.

Preferably, the magnetic sensors are magnetically coupled to the power conductor by placing the package proximate to the power conductor.

This invention still provides a single-package isolated power meter with digital output, which can be combined with other similar sensors to form a device used to measure the power consumption of common three-wire single-phase and commercial polyphase power supply systems.

As compared with the prior art, the present invention has the following beneficial effects:

The present invention senses current and voltage associated with a load by means of magnetic field or a combination of magnetic and electric fields. Because of the sensors used to detect the magnetic and electric fields are isolated from the working circuit of load, there is no direct connection between the integrated circuit and the power line. The critical electronics are thus isolated from the power line, which greatly enhances immunity of the measuring system to power transients thereby providing a measurement system with enhanced reliability.

The preferred implementation of the present invention utilizes tunneling magnetoresistive (TMR) sensors, which are composed of magnetic tunnel junction (MTJ) devices for detecting current, and capacitive bridges or additional MTJ sensors combined with a resistive coil in parallel with the load, for measuring voltage of the load. MTJ sensors have greater sensitivity and signal amplitude than GMR or AMR sensors, with similar resolution. This simplifies the system design by lowing the cost of the front end electronics required to interface the microcontroller in the application specific integrated circuit (ASIC) used to compute and report power consumption.

The present invention further includes the capability to compute power and various other electrical circuit parameters that may be of use in power metering applications. The power meter described in present invention is electrically isolated from the power line and it has the capability to communicate the computed circuit parameters with a digital communication system. This capability further simplifies power meter design as it eliminates the need to electrically isolate and convert the analog into a digital form.

And the aforementioned benefits combined with the characteristics of TMR sensors, provided by the present invention result in a superior power meter with lower cost, better stability, galvanic isolation, higher sensitivity, higher resolution, simple front end circuit design, and digital output that is easily interconnected with external data logging circuitry.

DETAILED DESCRIPTION OF THE INVENTION

The power meter of the present invention will be further described with reference to accompany drawings.

Example 1

Figure 1:
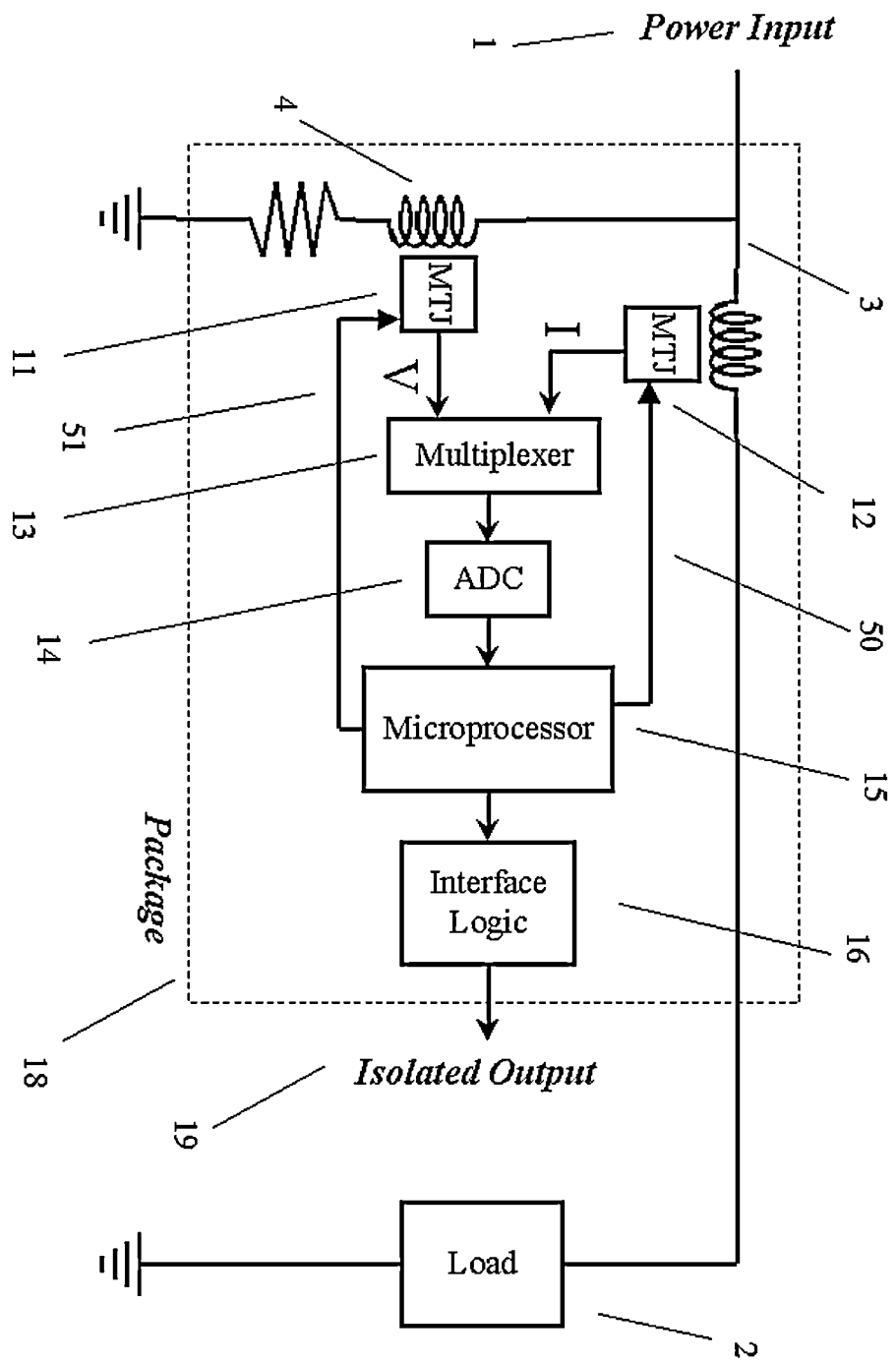
FIG. 1 is a schematic drawing showing a fully integrated power meter using a pair of MTJ sensors for measuring voltage and current associated with a load.

The single-package power meter 18 is shown in FIG. 1, wherein a DC or AC power source 1, power meter 18 and load 2 are connected in series. The power meter 18 is disposed between the power source 1 and load 2 in order to measure the power consumed by the load. A MTJ sensor 12 is placed in close proximity to the power conductor 3 that is connected with load 2 in series in order to measure magnetic field generated by the current flowing through the power conductor 3 and the load 2.

The MTJ sensor 12 is magnetically coupled to the power conductor 3, in order to measure the current flow in the power conductor 3. The MTJ sensor 12 is sensitive to the magnetic field generated by the current flow in the power conductor 3. In response to the current flowing in power conductor 3, the MTJ sensor 12 outputs a voltage that is proportional to the current flowing through the power conductor 3, which is the current consumption of the load. The voltage from MTJ sensor 12 is supplied to the Analog to Digital Convertor (ADC) 14 through the multiplexor 13, so that it can be converted to a digital form. The digital data is then supplied to microprocessor 15, which computes parameters including but not limited to instantaneous power and power consumption of load.

A second input to the microprocessor 15 is representative of the voltage across load 2, and a second MTJ sensor 11 supplies it. The voltage across the load 2 is detected by measuring the magnetic field generated by the current following through a voltage shunt coil 4 in parallel with the load 2. The voltage across the load 2 divided by the resistance of the shunt coil 4 is the current that flows through the voltage shunt coil 4. Thus the magnetic flux of magnetic field generated by the voltage shunt coil 4 is proportional to the voltage across load 2. MTJ sensor 11 is magnetically coupled to the magnetic field of shunt coil 4 and thereby produces a voltage signal that is proportional to the voltage across load 2.

Analog signals produced by MTJ sensors 12 and 11, respectively representing current and voltage consumed by load 2, can be communicated to the microprocessor 15 by various means. Generally, the voltage and current signals of load 2 provided by MTJ sensor 11 and MTJ sensor 12 must be sampled and digitized through the use of an analog to digital converter (ADC) 14 prior to passing them to the microprocessor 15. In the lowest cost implementation of the power transducer 18, only one ADC 14 is used, and the signals form MTJ sensor 11 and MTJ sensor 12 are sampled serially by using a multiplexer 13 and then converted by using ADC 14.

According to the sampling theorem, the ADC 14 must sample the voltage and current signals of load 2 provided by MTJ sensor 11 and MTJ sensor 12 at a frequency greater than 2 times of the frequency of the power source 1. Generally speaking, as shown in FIG. 1, the ADC 14 must sample the voltage and current signals of load 2 provided by MTJ sensor 11 and MTJ sensor 12 at a frequency greater than 4 times of the fundamental frequency of the power source 1. In operation, without the synchronous sampling clock controlling the sample of ADC 14 to the voltage and current signals produced by MTJ sensors 11 and 12 with the power source 1, it isn't enough that the ADC 14 sample the voltage and current signals of load 2 provided by MTJ sensor 11 and MTJ sensor 12 at a frequency greater than 4 times of the frequency of the power source 1. Without the synchronous clock, a safe minimum approximation for the sampling frequency of the ADC 14 is 16 times of frequency of the power source 1. Thus at an absolute minimum, the ADC 14 and multiplexer 13 combination as configured in 18, the sample frequency must be 32 times of the frequency of the power source 1. For a high accuracy power meter, the minimum sampling frequency of ADC 14 is 1920 Hz in order to meet the corresponding national measurement standards.

In order to be useful for kilowatt-hour metering applications, the power meter 18 should be provided the capability to compute several circuit parameters including but not limited to Root Mean Square (RMS) voltage, RMS current, real power, reactive power, apparent power, power factor, harmonic distortion, load impedance and admittance, DC voltage and DC current in DC circuit. These quantities are easily computed from the voltage and current signals provided by MTJ sensors 11 and 12.

Accurate computation of the desired parameters by microprocessor 15 relies on properly scaling the voltage and current waveforms provided by MTJ sensors 11 and 12. The scale factors will be dependent on the signal waveforms and the characteristics of the different sensors.

In order to simplify the power meter's 18 design and improve accuracy, the MTJ magnetic sensors' 11 and 12 outputs may be adjusted to keep them within optimal range of the ADC's 14 input. Two methods for controlling the response of MTJ magnetic sensors are easily applied. One method, illustrated in FIG. 2 involves controlling the bias voltage of the MTJ sensors. The other method, illustrated in FIG. 3, utilizes closed loop operation of an MTJ to compensate the magnetic field of the power conductor 3 and voltage shunt coil 4.

Figure 2:
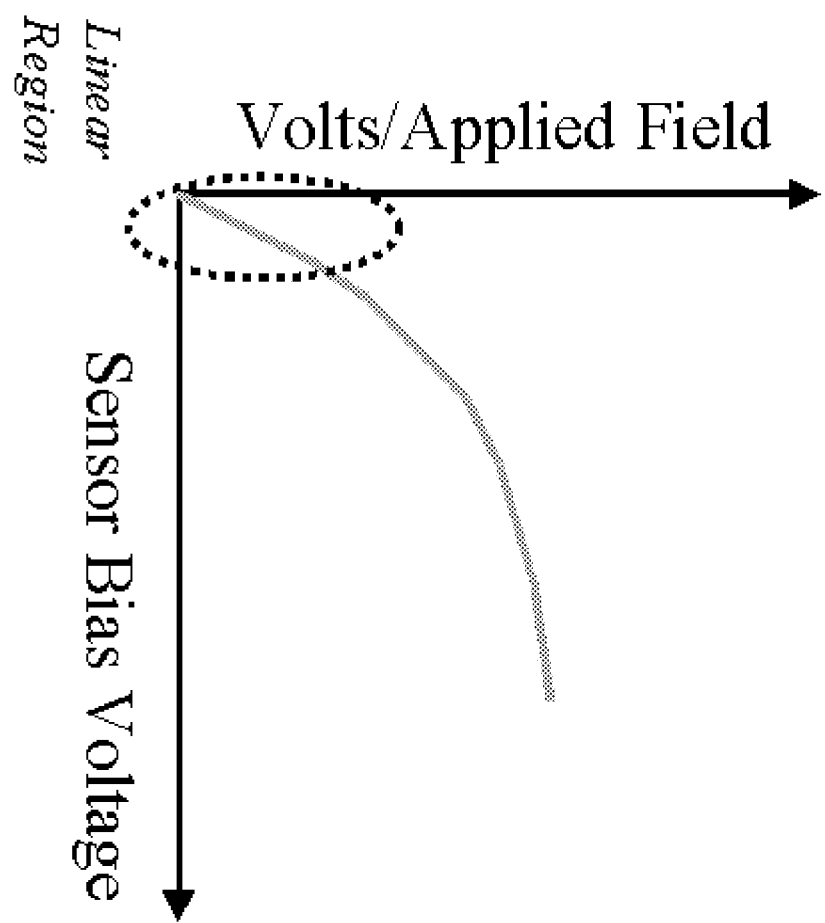
FIG. 2 shows a sensor bias response curve that can be used to control the magnitude of the output signal.

FIG. 2 shows an exemplary sensitivity response curve as a function of bias voltage applied to a MTJ sensor. At the low end of the bias voltage range, the output of the MTJ sensor at a fixed value of magnetic field is linearly proportional to the bias voltage. As the bias voltage is increased, the response curve becomes non-linear. In the present invention, both the liner and non-linear ranges can be used, provided the device is able to compute a non-linear calibration factor. Provided the response curve is known, the bias voltage of the MTJ sensor may be varied in order to maximize the signal-to-noise of the ADC 14 of the MTJ sensor. This may be accomplished by using the microprocessor 15 to compute the optimal bias voltage for the MTJ sensors, and the voltages may be fed back to the MTJ sensors 11 and 12 as shown by conductors 50 and 51. The microprocessor 15 would then scale the signal waveforms of MTJ sensors as follows:

$$V = V_{MTJ} \times \alpha \times \beta$$

$$I = V_{MTJ} \times a \times b$$

Wherein, $V_{MTJ}$ is the output voltage of a MTJ sensor, $\alpha$ is the output constant of magnetic field-voltage, $\beta$ is the bias voltage constant, a is the magnetic field-current constant, b is the bias current constant.

Figure 3:
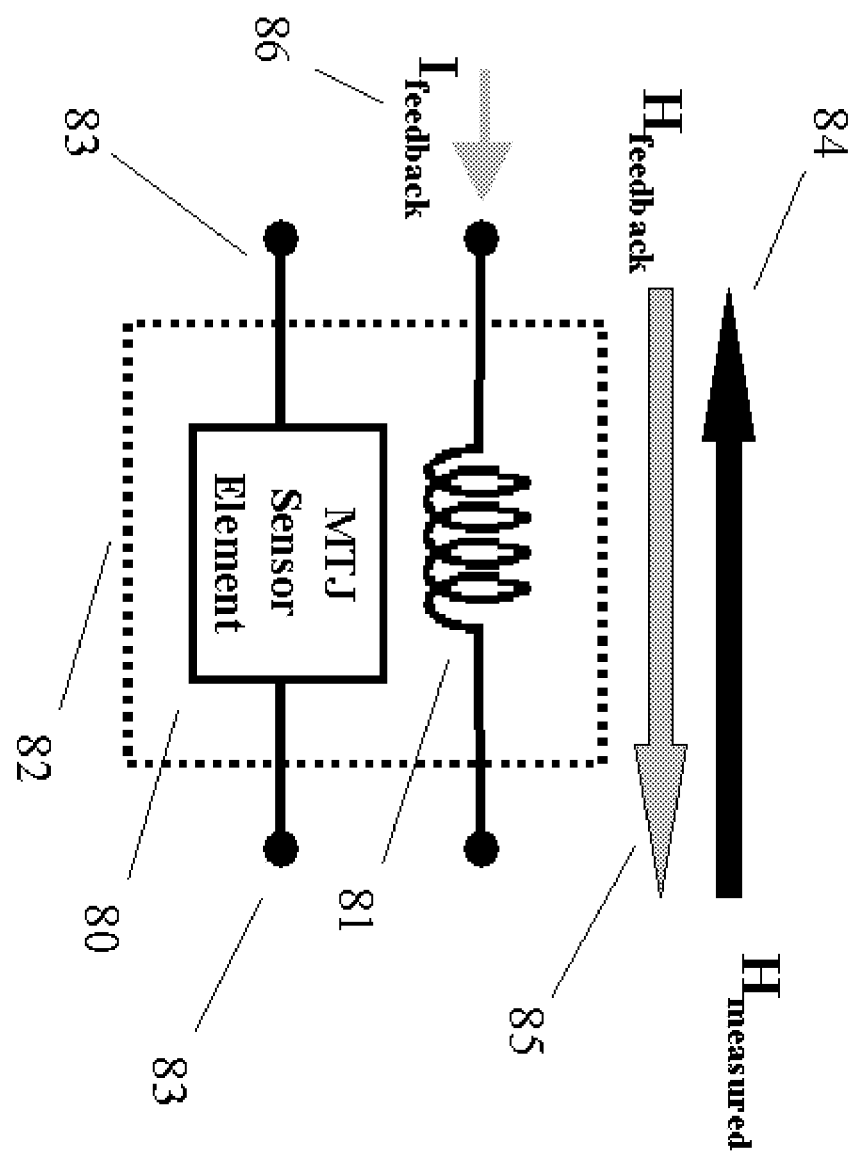
FIG. 3 is a schematic drawing showing a MTJ device using an on-chip electromagnet to control the magnitude of the output signal.

FIG. 3 shows an exemplary method for linearizing the output of magnetic field sensors, in which the sensors are supplied with a magnetic field that is in opposition to the field being measured. This is often referred to as closed loop operation. In this closed loop method, a magnetic field, $H_{feedback}$ 85, in opposition to the field being measured, $H_{measured}$ 84, is supplied by the on-chip electromagnet 81. In closed loop mode, the output of MTJ sensor 80 is held constant by varying the current through the electromagnet 81. Because the current 86 through the electromagnet 81 is proportional to the compensating magnetic field, and the compensating magnetic field is equal to the magnetic field being measured 84, the current 86 flowing through the electromagnet 81 is directly proportional to the magnetic field being measured. Thus in this method of operation, the voltage and current associated with load 2 is given as follows:

$$V = I_{Feedback} \times \alpha_{HI} \times \beta_{VH}$$

$$I = I_{Feedback} \times \alpha_{HI} \times \gamma_{CH}$$

Wherein, V and I is the voltage and current of load 2, $I_{Feedback}$ is the feedback current, $\alpha_{HI}$ is the factor of $H_{measured} - I_{Feedback}$, $\beta_{VH}$ is the factor of $V - H_{measured}$, $\gamma_{CH}$ is the factor of $I - H_{measured}$.

When MTJ sensors are used for voltage and current transducers, the microprocessor 15 is easily designed to provide the appropriate calibration parameters as well as to control the bias voltage or feedback current necessary to keep the MTJ sensor outputs within range of the ADC's 14 optimal response, without the use of variable gain preamplifiers.

The power meter 18 is intended to provide a digital signal to communicate the measured parameters with an external system that might comprise a data-logger, a microprocessor, or other electronic system for use in power metering applications. In order to do so, the quantities computed by the microprocessor 15 must be converted into a format that is compatible with the off-chip electronics. The power meter thus includes an interface logic circuit 16 to convert the data into one of various formats including but not limited to one of the following standards, USB, RS-232, I²C, or SPI.

Example 2

The difference of the power meter described in example 2 from in example 1 is that the resistor and capacitively coupled voltage divider rather than the voltage shunt coil is used to measure the voltage across the load.

Figure 4:
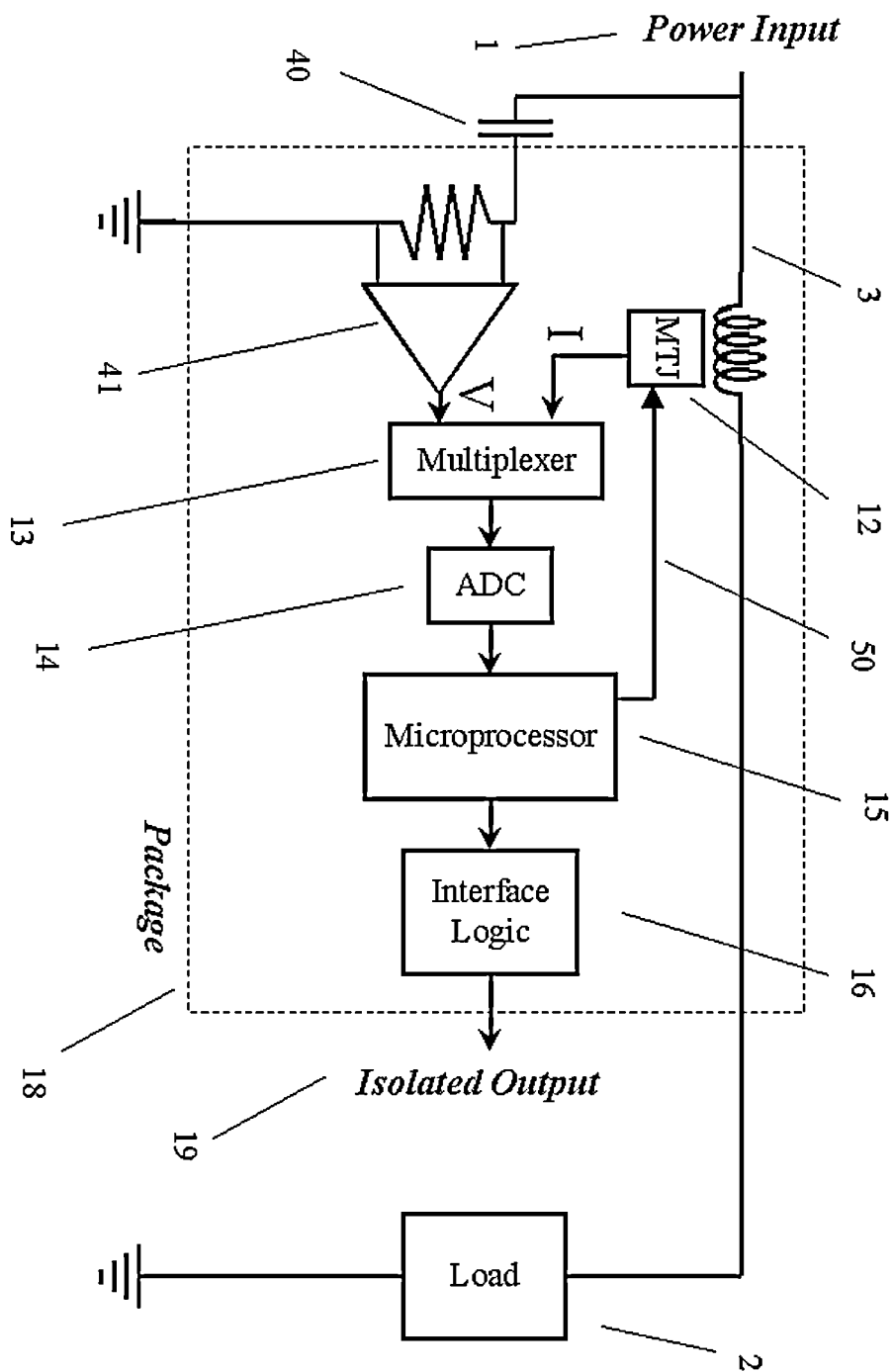
FIG. 4 is a schematic drawing showing a fully integrated power measurement system using a MTJ sensor for measuring the current associated with a load, and using a capacitively coupled voltage divider for measuring voltage associated with a load.

FIG. 4 shows an alternative arrangement of the power meter 18 that uses a capacitively coupled voltage divider 40 and buffer amplifier 41 to perform the galvanically isolated load voltage measurement. This arrangement may be used to lower the power meter's 18 cost of fabrication and to permit the voltage waveform to be selectively filtered by the user to eliminate the interfering signals or noise in the power lines. The arrangement shown in FIG. 4 is best suited for an AC power application in which the bandwidth of the voltage waveform is filtered. In this arrangement, the capacitor 40 is external to the power meter 18 package. It can set the cut-off frequency of the voltage waveform by choosing different capacitors. Additionally, a capacitive-resistive network to limit both the upper and lower cut-off frequency of the voltage waveform that is fed to microprocessor 15 may replace the external capacitor 40.

Example 3

Figure 5:
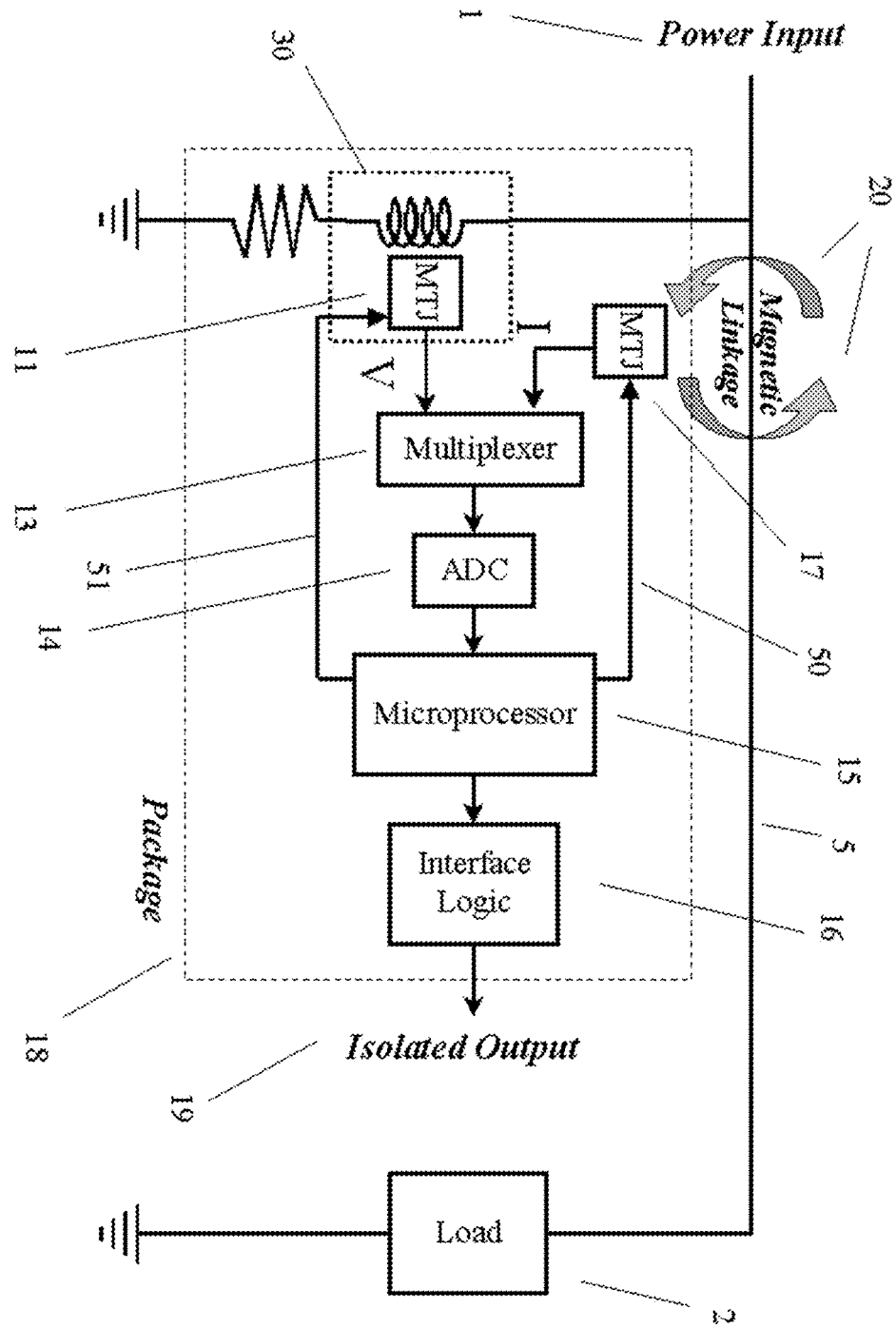
FIG. 5 is a schematic drawing indicating means for measuring current flowing through an external conductor without the use of slotted ferromagnetic toroids.
Figure 6:
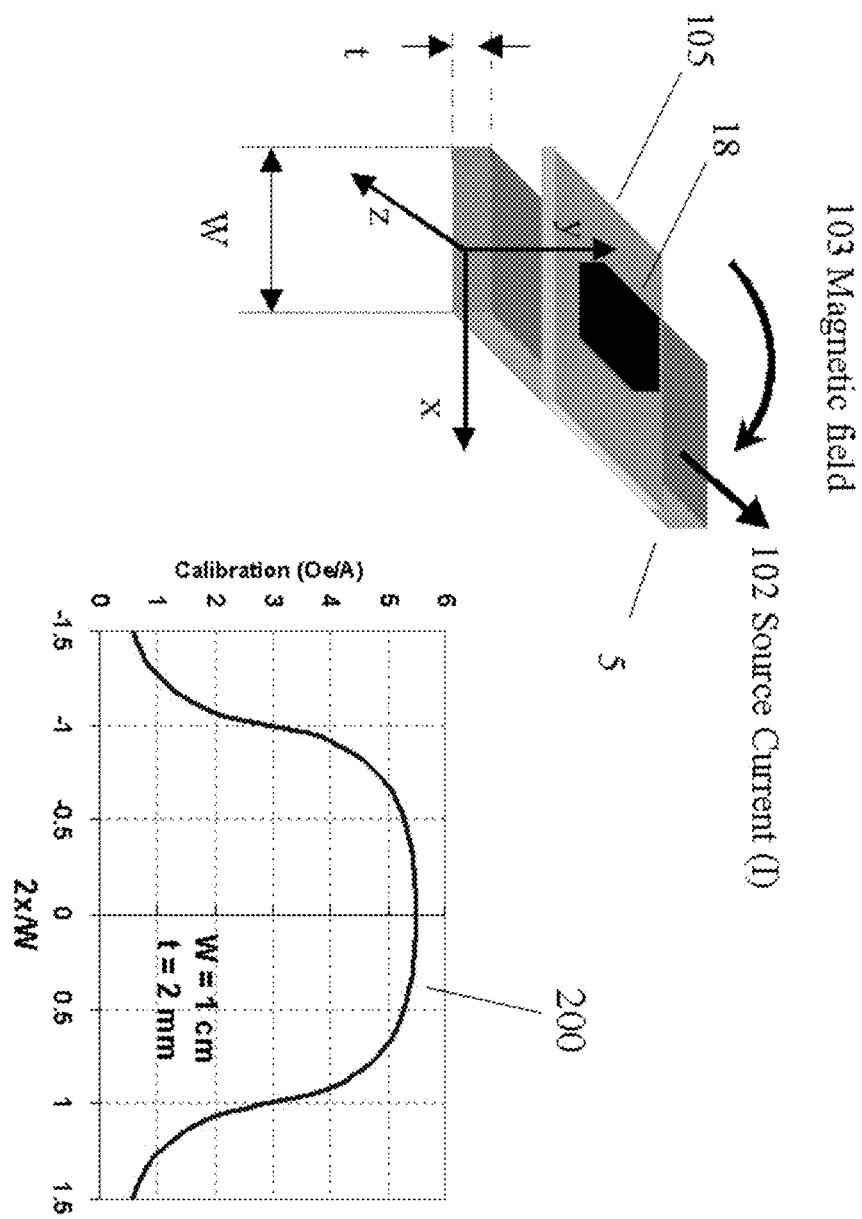
FIG. 6 is a theoretical curve depicting the magnetic field due to current flowing through an external conductor.

As is shown in FIG. 5 and FIG. 6, because of geometric constrains related to minimum conductor sizing for current being supplied to a load, it is often impractical to locate a power conductor 3 within the package of the power meter 18. In this case, the power meter may be design for placement proximate to an external power conductor 5. A first magnetic sensor 17 within the power meter 18 may detect the magnetic field generated by the external power conductor 5. Magnetic coupling 20, may be accomplished by placing the power conductor through a ferromagnetic toroid 20, and placing the power meter 18 within a gap in the toroid. Alternatively, the power meter might be placed tightly against a flat side of a current carrying bus bar. This arrangement is shown schematically in FIG. 6. Here the power meter 18 sits atop an insulating layer 105, which might be a circuit that separates the power meter 18 from the power conductor 5. The current 102 flowing through the power conductor 5 then creates a magnetic field 103 that is detected by an MTJ sensor 112 within the power meter 18.

The calibration for a sensor placed on top of a square conductor is given by the following equation:

$$B_x(x, y) = \frac{\mu_0}{4\pi} \frac{I}{tW} \left( (x - W/2) \left\{ \ln\left[\frac{(x-W/2)^2 + y^2}{(x-W/2)^2 + (y+t)^2}\right] \right\} - \right.$$
$$(x + W/2) \left\{ \ln\left[\frac{(x+W/2)^2 + y^2}{(x+W/2)^2 + (y+t)^2}\right] \right\} +$$
$$2(y+t) \left\{ A\text{Tan}\left[\frac{x+W/2}{y+t}\right] - A\text{Tan}\left[\frac{x-W/2}{y+t}\right] \right\} -$$
$$\left. 2y \left\{ A\text{Tan}\left[\frac{x+W/2}{y}\right] - A\text{Tan}\left[\frac{x-W/2}{y}\right] \right\} \right)$$

where "W" is the width of the conductor, "t" is the thickness, "x" is the distance from the center of the conductor along a line parallel to the top surface, and "y" is the height above the conductor. An exemplary plot of the current to field calibration at a distance above the current busbar is given at 200 in FIG. 5.

Because the entire power meter 18 is subjected to the magnetic field produced by the current in the external conductor 5, a second MTJ sensor 11 used to measure the voltage of load 2 must be magnetically shielded from magnetic field produced by the conductor 5 through the magnetic shield structure 30. This is illustrated in FIG. 5.

Example 4

The difference between the power meter described in example 4 and that in example 3 is that the voltage divider network formed by the resistor and couple capacitor rather than the voltage shunt coil is used to measure the voltage across the load.

Figure 7:
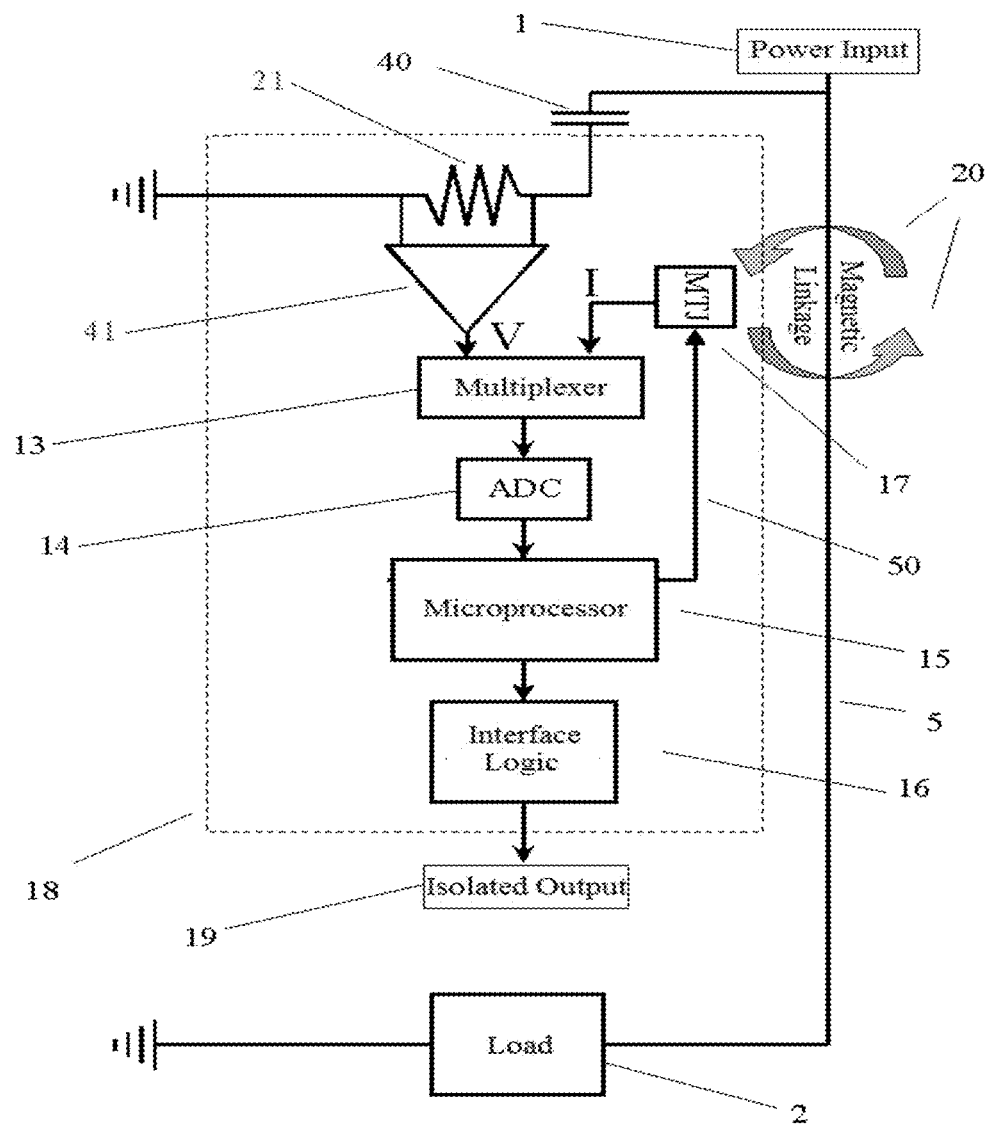
FIG. 7 is a schematic drawing showing a power measurement transducer using a MTJ sensor for measuring current associated with a load and a capacitively coupled amplifier for measuring voltage associated with a load.

FIG. 7 shows an alternative arrangement of the power meter 18 that uses a capacitively coupled voltage divider 40 and buffer amplifier 41 to perform the galvanically isolated load voltage measurement in addition to using an external power conductor 5. This arrangement may be used to lower the power meter's 18 cost of fabrication and to permit the voltage waveform to be selectively filtered by the user to eliminate the interfering signals or noise in the power lines. The arrangement shown in FIG. 7 is best suited for an AC power application in which the bandwidth of the voltage waveform is filtered, and the power conductor 5 is too large to fit within the power meter 18 package. In this arrangement, the capacitor 40 is external to the power meter 18 package. Capacitor 40 may be chosen to set the low frequency cut-off of the voltage waveform. Additionally, a capacitive-resistive network to limit both the upper and lower cut-off frequency of the voltage waveform that is fed to microprocessor 15 may replace the external capacitor 40.

Figure 8:
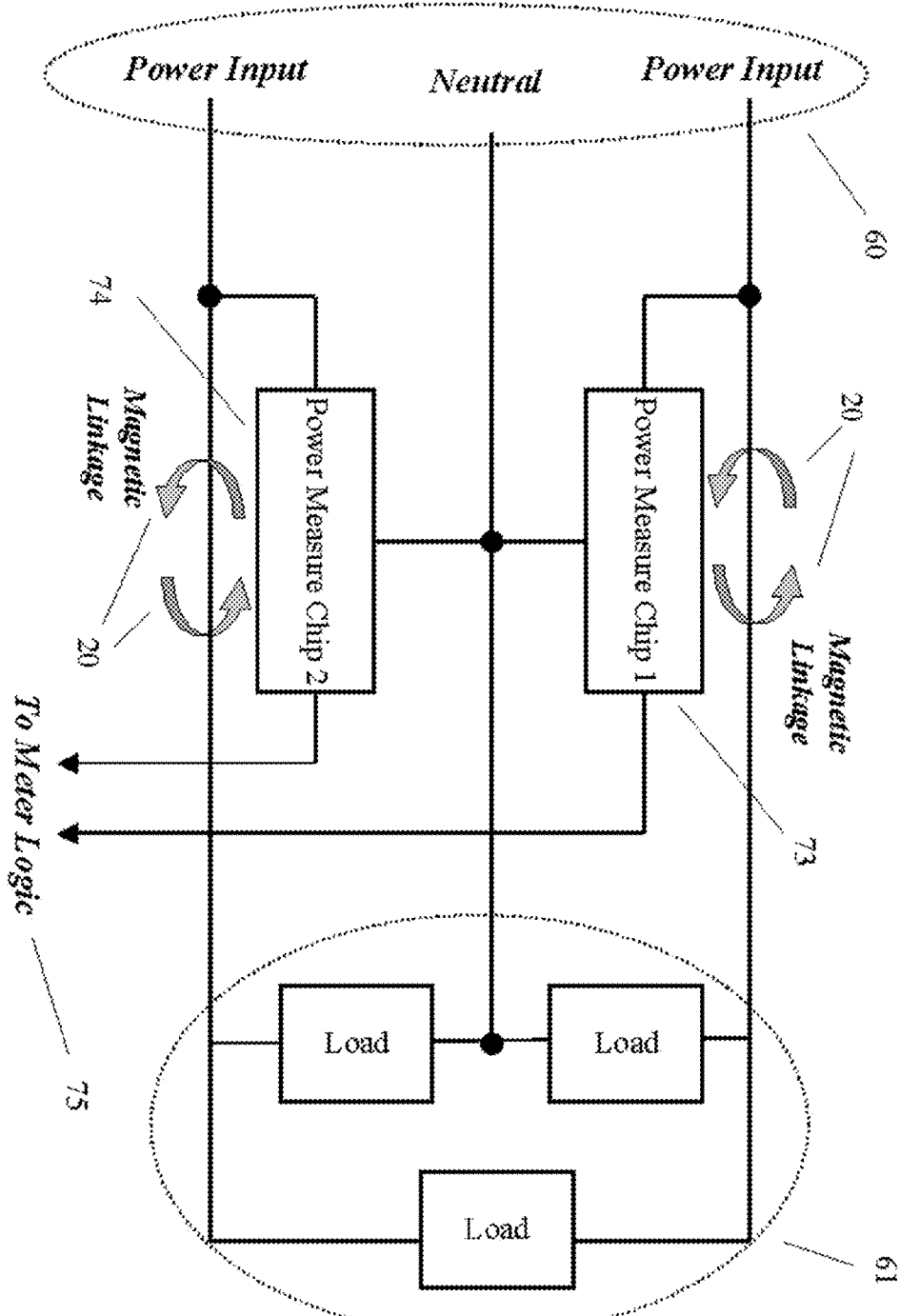
FIG. 8 shows a method for combining power transducers for use in residential three-wire or commercial polyphase service kilowatt-hour metering.

FIG. 8 shows an exemplary kilowatt-hour meter configuration utilizing cascaded power meters 18 to measure the current and voltage consumed by a typical residential load 61 from each leg of a residential three-wire power supply 60. The power meters are magnetically coupled to each hot-wire in the power transmission line by either using a slotted magnetic toroid, or by placing the power meters 18 against the side of a busbar. In this type of kilowatt-hour metering application, the outputs 75 of the power meters 73 and 74 each provide a measure of the power consumed in each leg or phase of the power delivery system. The digital outputs 75 from each power meter 18 must be connected to other electronics within the meter in order to compute the total power consumed by the load 2. Because the power meters 18 output a digital signal that can be in any of a number of possible formats, and the digital outputs 75 are electrically isolated from the power supply 60, the design of total measuring power consumption system is more simple and the cost is reduced as there is no need for the kilowatt-hour meter manufacturer to digitize and isolate analog signals form discrete voltage and current sensors. Additionally, power is computed within the power meter 18, which simplifies the algorithms and design of the follow-up measuring power system.

It will be apparent to those skilled in the art that various modifications can be made to the present invention without departing from the scope or spirit of the invention. Further, it is intended that the present invention cover modifications and variations of the present invention provided that such modifications and variations come within the scope of the appended claims and their equivalence.

What is claimed is:

1. A single-package power meter (18) for measuring the power consumed by a load (2) connected to an internal power conductor (3), wherein the power meter (18) comprises:
   an internal power conductor (3) that is connected in series between the power supply (1) and load (2);
   an internal resistive voltage shunt coil (4) that is connected in series between the internal power conductor (3) and an external ground or a neutral connector of the power system;
   a first magnetic sensor means (12) disposed proximate to the internal power conductor (3) and magnetically coupled to the magnetic field generated by the current following through the power conductor, which is used for detecting the magnetic flux around the power conductor and producing a first output responsive to the magnetic flux and indicative of the current (I) flowing in the power conductor;
   a second magnetic sensor means (11) disposed proximate to the internal resistive voltage shunt coil (4) that is connected in parallel to the load (2) and magnetically coupled to the current following through the voltage shunt coil (4), which is used for detecting current flowing in the internal resistive voltage shunt coil (4) and providing a second output responsive to the current flowing in the internal resistive voltage shunt coil (4) and indicative of the voltage (V) across the load (2);

a sampling module (14) for sampling the voltage signal (V) and current signal (I) and converting them into digital forms;

a processing module (15) for processing the sampled data;

a multiplexer (13) for selectively sampling the current signal (I) output by the first magnetic sensor means (12) and the voltage signal (V) output by the second magnetic sensor means (11); and an interface logic module (16) for transforming the processed data into a format that is compatible with an off-chip system;

at least one of the magnetic sensors means (11, 12) has a characteristic bias response curve for controlling the magnitude of the sensor response and automatically adjusting the range of the power meter or at least one of the magnetic sensor means (11, 12) has an on-chip electromagnet used to linearize the sensor response;

a magnetic field $H_{feedback}$ 85, in opposition to the field being measured $H_{measured}$ 84 is supplied by the on-chip electromagnet.

2. The single-package power meter (18) as claimed in claim 1, wherein the first magnetic sensor means (12) and the second magnetic sensor means (11) comprise MTJ sensors.

3. The single-package power meter (18) as claimed in claim 1, wherein the first magnetic sensor means (12), the second magnetic sensor means (11), the sampling module (14), the processing module (15), and the interface logic module (16) are electrically and physically isolated from the voltage shunt coil (4) and the load (2), galvanic isolation is accomplished through the use of insulating layers and magnetic coupling.

4. The single-package power meter (18) as claimed in claim 1, wherein the first magnetic sensor means (12) and the second magnetic sensor means (11) comprises at least one MTJ sensor respectively.

5. A single-package isolated power meter having a digital output as claimed in claim 1, wherein the power meter can be combined with other similar power meters to form a watt-hour meter for measuring power consumption in common three wire single phase and commercial polyphase power systems.

6. A single-package power meter (18) for measuring the power consumed by a load (2) connected to an internal power conductor (3), wherein the power meter (18) comprises:

an internal power conductor (3) that is connected in series between the power supply (1) and load (2);

an external capacitor (40) for galvanically isolating the voltage detection circuitry from the power conductor, which may be replaced with an RC network to set the bandwidth of the circuit;

a first magnetic sensor means (12) disposed proximate to the internal power conductor (3) and magnetically coupled to the current following through the internal power conductor, which is used for detecting the magnetic flux around the internal power conductor (3) and producing a first output responsive to the magnetic flux and indicative of the current flowing in the internal power conductor (3);

an internal resistor (21) connected to the input of an amplifier or buffer circuit, which is used in conjunction with the external capacitor (40) to form a voltage divider network for measuring the voltage across the load;

a sampling module (14) for sampling the voltage signal (V) and current signal (I) and converting them into digital forms;

a processing module (15) for processing the sampled data;

a multiplexer (13) for selectively sampling the current signal (I) of the magnetic sensor means and the voltage signal (V) output by the voltage divider network formed by the internal resistor (21) and external capacitor (40); and an interface logic module (16) for transforming the processed data into a format that is compatible with an off-chip system;

at least one of the magnetic sensors means (11, 12) has a characteristic bias response curve for controlling the magnitude of the sensor response and automatically adjusting the range of the power meter or at least one of the magnetic sensor means (11, 12) has an on-chip electromagnet used to linearize the sensor response;

a magnetic field $H_{feedback}$ 85, in opposition to the field being measured $H_{measured}$ 84 is supplied by the on-chip electromagnet.

7. The single-package power meter (18) as claimed in claim 6, wherein the magnetic sensor means (12) comprises at least one MTJ sensor.

8. The single-package power meter (18) as claimed in claim 6, wherein the magnetic sensor means (12), the sampling module (14), the processing module (15), and the interface logic module (16) are electrically and physically isolated from the power supply (1), galvanic isolation is accomplished through the use of magnetic coupling, insulating layers and the external capacitor.

9. A single-package power meter (18) for measuring the power consumed by a load (2) connected to an external power conductor (5), wherein the power meter (18) comprises:

an external power conductor (5) that is connected in series between the power supply (1) and the load (2);

an internal resistive voltage shunt coil (4) that is connected in series between the power supply (1) and an external ground or a neutral connector of the power system, the voltage shunt coil being thereby connected in parallel with the load;

a first magnetic sensor means (17) within the power meter (18) package disposed such that it can be magnetically coupled to the magnetic field generated by the current following through the external power conductor (5), which is used for detecting the magnetic flux emanating from the external power conductor (5) and producing a first output responsive to the magnetic flux of the external power conductor (5) and indicative of the current flowing in the said external power conductor (5);

a second magnetic sensor means (11) disposed proximate to the internal resistive voltage shunt coil (4) connected in parallel to the load (2) and magnetically coupled to the current following through the internal resistive voltage shunt coil (4), which is used for detecting current flowing in the internal resistive voltage shunt coil (4) and providing a second output responsive to the current flowing in the internal resistive voltage shunt coil (4) and indicative of the voltage across the load (2);

an internal high permeability shielding structure (30) for shielding the second magnetic field sensor (11) from the magnetic field produced by the external power conductor (5), which is located far enough from the first magnetic sensor means (17) such that it does not significantly reduce the magnetic field from the external power conductor (5);

a sampling module (14) for sampling the voltage signal (V) and current signal (I) and converting them into digital forms;

a processing module (15) for processing the sampled data;

a multiplexer (13) for selectively sampling the current signal (I) output by the first magnetic sensor means (17) and the voltage signal (V) output by the second magnetic sensor means (11); and an interface logic module (16) for transforming the processed data into a format that is compatible with an off-chip system;

at least one of the magnetic sensors means (11, 12) has a characteristic bias response curve for controlling the magnitude of the sensor response and automatically adjusting the range of the power meter or at least one of the magnetic sensor means (11, 12) has an on-chip electromagnet used to linearize the sensor response;

a magnetic field $H_{feedback}$ 85, in opposition to the field being measured $H_{measured}$ 84 is supplied by the on-chip electromagnet.

10. The single-package power meter (18) as claimed in claim 9, wherein the first magnetic sensor means (17) and the second magnetic sensor means (11) comprise MTJ sensors.

11. The single-package power meter (18) as claimed in claim 9, wherein the first magnetic sensor means (17), the second magnetic sensor means (11), the sampling module (14), the processing module (15), and the interface logic module (16) are electrically and physically isolated from the power supply (1) and internal resistive voltage shunt coil (4), galvanic isolation is accomplished through the use of insulating layers.

12. The single-package power meter (18) as claimed in claim 9, wherein the first magnetic sensor means (17) and the second magnetic sensor means (11) are comprised of at least one MTJ sensor each.

13. The single-package power meter (18) as claimed in claim 12, wherein the internal high permeability shielding structure (30) is used to concentrate the magnetic flux from the power conductor into the region occupied by the first magnetic sensor means.

14. The single-package power meter (18) as claimed in claim 9, wherein the first magnetic sensor (17) is magnetically coupled to the external power conductor (5) by placing the power meter (18) proximate to the external power conductor (5).

15. The single-package power meter (18) as claimed in claim 9, wherein the first magnetic sensor (17) is magnetically coupled to the external power conductor (5) through the use of a slotted ferromagnetic toroid (20) external to the device package.

16. A single-package power meter (18) for measuring the power consumed by a load (2) connected to an external power conductor (5), wherein the power meter comprises:

an external power conductor (5) that is connected in series between the power supply (1) and the load (2);

a magnetic sensor means (17) located within the power meter (18) package such that it can be magnetically coupled to the magnetic field generated by the current following through the external power conductor (5), which is used for detecting the magnetic flux emanating from an external power conductor (5) and producing a first output responsive to the magnetic flux of external power conductor and indicative of the current flowing in the external power conductor;

an external capacitor (40) for galvanically isolating the voltage detection circuitry from the power conductor, which may be replaced with an RC network to set the bandwidth of the circuit;

an internal resistor (21) connected across the input of an amplifier or buffer (41) circuit, which is used in conjunction with the external capacitor (40) to form a voltage divider network for measuring the voltage across the load (2);

a sampling module (14) for sampling the voltage signal (V) and current signal (I) and converting them into digital forms;

a processing module (15) for processing the sampled data;

a multiplexer (13) for selectively sampling the current signal (I) output by the magnetic sensors and the voltage signal (V) output by the voltage divider network formed by the internal resistor (21) and external capacitor (40);

an interface logic module (16) for transforming the processed data into a format that is compatible with an off-chip system;

at least one of the magnetic sensors means (11, 12) has a characteristic bias response curve for controlling the magnitude of the sensor response and automatically adjusting the range of the power meter or at least one of the magnetic sensor means (11, 12) has an on-chip electromagnet used to linearize the sensor response;

a magnetic field $H_{feedback}$ 85, in opposition to the field being measured $H_{measured}$ 84 is supplied by the on-chip electromagnet.

17. The single-package power meter (18) as claimed in claim 16, wherein the magnetic sensor means (17) comprises at least one MTJ sensor.

18. The single-package power meter (18) as claimed in claim 16, wherein the magnetic sensor means (17), the sampling module (14), the processing module (15), and the interface logic module (16) are electrically and physically isolated from the voltage divider network and load, galvanic isolation being accomplished through the use of insulating layers and the external capacitor (40).

19. The single-package power meter (18) as claimed in claim 16, wherein the magnetic sensor (17) is magnetically coupled to the external power conductor (5) through the use of a slotted ferromagnetic toroid (20) external to the device package.

20. The single-package power meter (18) as claimed in claim 16, wherein the magnetic sensor (17) is magnetically coupled to the external power conductor (5) by placing the package proximate to the external power conductor (5).

* * * * *